United States Patent
Losehand et al.

(10) Patent No.: US 6,448,162 B1
(45) Date of Patent: Sep. 10, 2002

(54) METHOD FOR PRODUCING SCHOTTKY DIODES

(75) Inventors: Reinhard Losehand; Hubert Werthmann, both of München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/722,081

(22) Filed: Nov. 27, 2000

Related U.S. Application Data

(63) Continuation of application No. PCT/DE99/01428, filed on May 11, 1999.

(30) Foreign Application Priority Data

May 26, 1998 (DE) .......................................... 198 23 481

(51) Int. Cl.[7] .............................................. H01L 21/28
(52) U.S. Cl. ........................ 438/580; 438/573; 438/575; 438/581; 438/583
(58) Field of Search .................................. 438/570–583

(56) References Cited

U.S. PATENT DOCUMENTS 4,261,095 A  * 4/1981 Dreves et al. ................ 29/571
4,414,737 A  * 11/1983 Menjo et al. ................. 29/578

FOREIGN PATENT DOCUMENTS

| GB | 1 265 260 | 3/1972 |
| JP | 60157268 | 8/1985 |
| JP | 01042858 | 2/1989 |

OTHER PUBLICATIONS

International Publication WO 91/04581 (Theden), dated Apr. 4, 1991.

* cited by examiner

*Primary Examiner*—Ha Tran Nguyen
(74) *Attorney, Agent, or Firm*—Laurence A. Greenberg; Werner H. Stemer; Gregory L. Mayback

(57) ABSTRACT

A method for producing a Schottky diode formed of a doped guard ring in an edge area of the Schottky contact is described. The guard ring is produced by depositing a high barrier material, especially made of platinum, on the surface of the semiconductor layer. The surface is provided with a structured masking layer beforehand, and which is subsequently etch-backing.

7 Claims, 2 Drawing Sheets

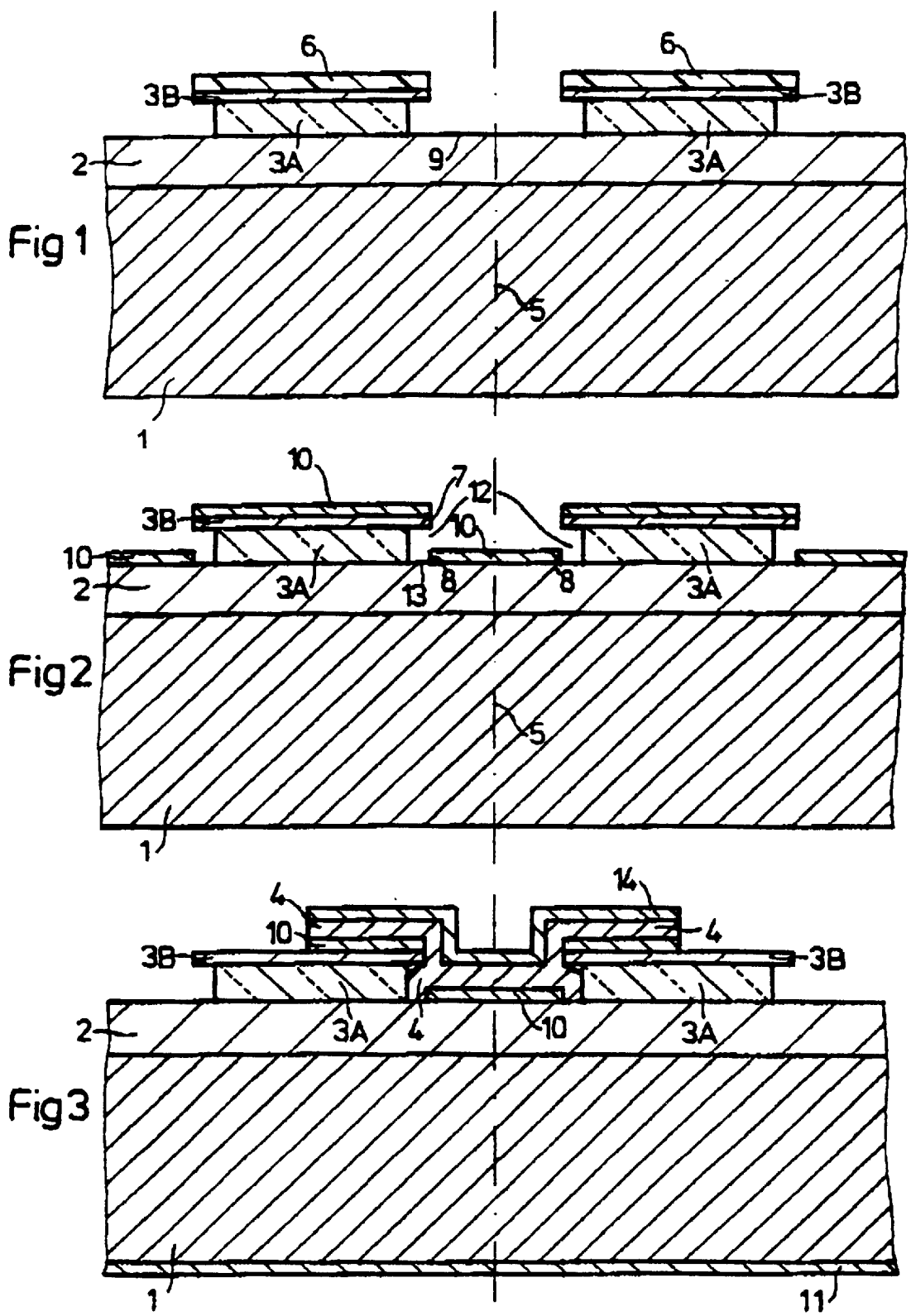

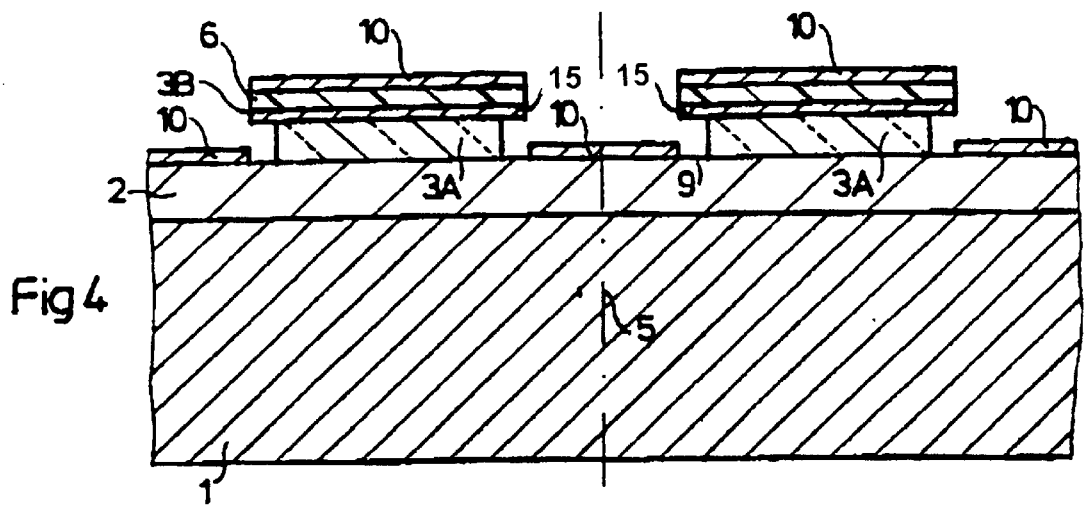
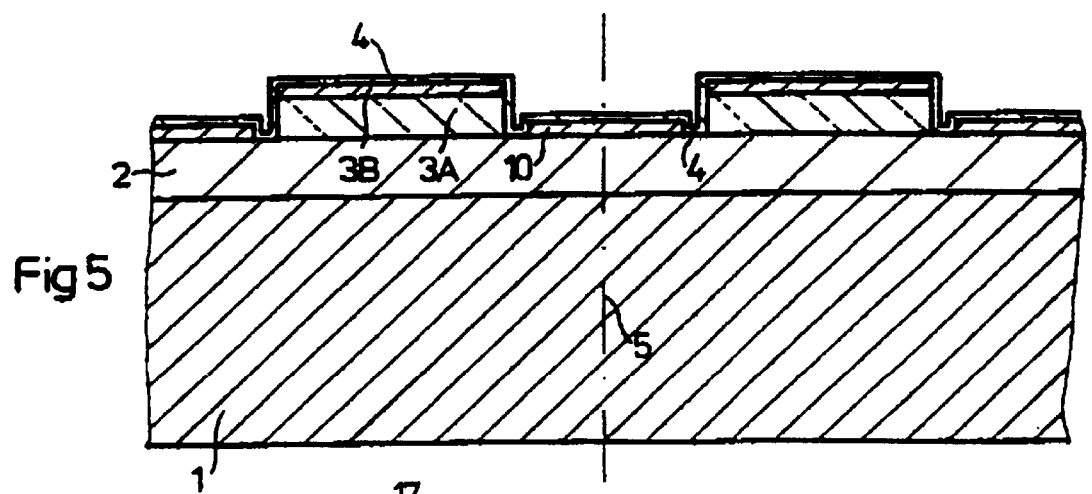
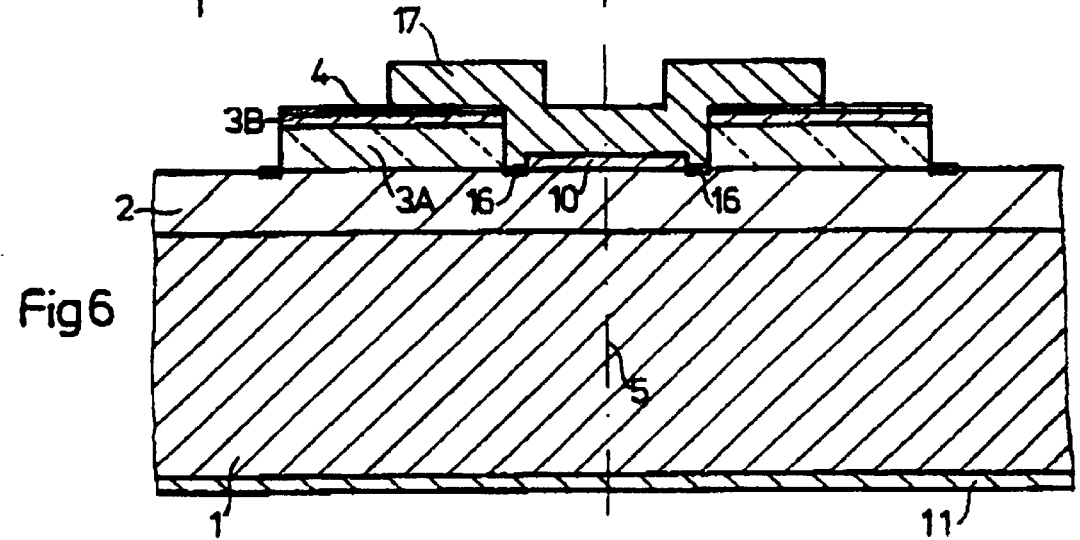

METHOD FOR PRODUCING SCHOTTKY DIODES

CROSS-REFERENCE TO RELATED APPLICATION

This is a continuation of copending International Application PCT/DE99/01428, filed May 11, 1999, which designated the United States.

BACKGROUND OF THE INVENTION

Field of the Invention

The invention relates to a method for producing Schottky diodes having a protective ring in an edge region of a Schottky contact. The invention furthermore relates to a Schottky diode.

During the production of very small-area Schottky diodes, that is to say of Schottky diodes having a diameter of the order of magnitude of 5 to 10 μm, eliminating the edge effects poses considerable difficulties. It is known to reduce the edge effects by use of a doped protective ring being introduced into the semiconductor substrate and/or into the topmost epitaxial layer using implantation technology. In the case of very small-area Schottky diodes, however, a doped protective ring produced by photomasks constitutes such a considerable additional capacitance that Schottky diodes produced in such a way cannot be used in relatively high frequency ranges. applications in the 77 GHz frequency range demand that the Schottky diode have a total capacitance of approximately 40 fF, which permits a parasitic capacitance of at most 10 fF.

SUMMARY OF THE INVENTION

It is accordingly an object of the invention to provide a method for producing Schottky diodes which overcomes the above-mentioned disadvantages of the prior art method of this general type, which have typical diameters of 5 to 10 μm and can be used in high-frequency ranges typically of 77 GHz and above.

With the foregoing and other objects in view there is provided, in accordance with the invention, a method for producing a Schottky diode. The method includes the step of providing a semiconductor layer having a surface. A mask layer is produced on the semiconductor layer. The mask layer is formed so as to leave a region free of the mask layer on the surface of the semiconductor layer, the region provided for forming a Schottky contact. The mask layer and the semiconductor layer are covered by a barrier metal layer having edges for forming the Schottky contact. A ring shaped area remains free on the surface of the semiconductor layer between the mask layer and the edges of the barrier metal layer. The ring shaped area is covered by a high barrier metal and the high barrier metal forms a protective ring.

The invention provides for the protective ring to be produced after the production of the Schottky contact by depositing an electrically conductive protective ring material onto the surface of the semiconductor layer, which surface is provided with a patterned masking layer.

Following the principle of the invention, the protective ring material constitutes a metal, in particular a high barrier metal, which has, in particular, platinum.

The protective ring material is expediently applied by vapor deposition or by being sputtered on.

A further preferred embodiment of the invention may provide for the patterned masking layer to be etched back by undercutting prior to the deposition of the Schottky contact material using a patterned covering layer.

In accordance with an added feature of the invention, there is the step of applying the high barrier metal to a thickness of approximately 0.1 μm.

In accordance with an additional feature of the invention, there is the step of forming the mask layer as a two-part layer formed of a silicon oxide layer and, on top of that, a silicon nitride layer is applied and the mask layer is patterned. The silicon nitride layer is undercut for forming overhanging rims.

In accordance with another feature of the invention, there is the step of applying the silicon oxide layer to a thickness of approximately 0.2 μm and applying the silicon nitride layer to a thickness of approximately 0.1 μm.

In accordance with a further feature of the invention, there is the step of forming the barrier metal layer by depositing titanium to a thickness of at most 0.1 μm.

In accordance with a concomitant feature of the invention, there is the step of forming the semiconductor layer from silicon and siliconizing the high barrier metal after its applied.

Other features which are considered as characteristic for the invention are set forth in the appended claims.

Although the invention is illustrated and described herein as embodied in a method for producing Schottky diodes, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, sectional view of a semiconductor wafer with a patterned oxide and nitride layer mask and a photoresist mask according to the invention;

FIG. 2 is a sectional view of the semiconductor wafer according to FIG. 1 after a Schottky contact material has been applied;

FIG. 3 is a sectional view of the semiconductor wafer after the deposition of a protective ring material and after the deposition and patterning of contact metallization layers;

FIG. 4 is a sectional view of the semiconductor wafer according to FIG. 1 after the vapor deposition of the Schottky contact material in accordance with a second exemplary embodiment of the invention has been performed;

FIG. 5 is a sectional view of the semiconductor wafer according to FIG. 4 after the deposition of the protective ring material; and FIG. 6 is a sectional view of the semiconductor wafer according to FIG. 5 after the deposition and patterning of the contact metallization layers.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a substrate 1 as the starting point of the method of the invention. The substrate 1 is composed of a semiconductor material, and has a semiconductor layer 2, which is deposited epitaxially thereon. On the epitaxially deposited semiconductor layer 2 there is a masking layer formed of a silicon oxide layer 3A having a thickness of approximately 0.2 µm, and a low-pressure silicon nitride layer 3B having a thickness of approximately 0.1 µm, which is deposited on the silicon oxide layer 3A under low pressure. For the definition of an active area of the Schottky diode and for the etching of the silicon nitride layer 3B, a photoresist layer 6 is patterned using lithography technology known per se. This is followed by targeted undercutting of the silicon oxide layer 3A likewise using known methods, the depth of the undercutting typically being at most 0.2 µm. Reference numeral 5 designates an axis of symmetry of the Schottky diode, which is configured to be rotationally symmetrical. The substrate 1 may be composed for example of $n^+$-doped silicon, while the semiconductor layer 2 may be composed of n-doped silicon. This choice of material is not mandatory, however. The substrate 1 and semiconductor layer 2 may also have the mirror-reversed p-type doping or be composed of different semiconductor material such as, for example, germanium, gallium arsenide or indium phosphide. The masking layer 3A, 3B may be composed of any desired insulator.

FIG. 2 shows a semiconductor wafer according to FIG. 1 in which, after the removal of the photoresist layer 6 by resist stripping, a barrier metal 10 has been deposited over the whole area for the purpose of forming the Schottky contact, in particular has been vapor-deposited perpendicularly to a surface 9 of the semiconductor layer 2. The thickness of the metal layer 10 is approximately 0.1 µm at most. A suitable metal for the layer 10 is titanium, for example.

Afterwards, a high barrier metal 4 such as platinum, for example, is sputtered on isotropically, the metal 4 indiffusing through a gap 12 between a nitride edge 7 and a titanium edge 8 and covering an open silicon ring area 13 between the titanium layer 10 and the oxide layer 3A (FIG. 3).

This is followed by vapor deposition with a gold layer 14 according to FIG. 3 in order, if appropriate, to fill the gap still remaining between the nitride edge 7 and the titanium edge 8 and to produce a bondable surface. The thus completed contact with gold, illustrated in the sectional view in FIG. 3, is also known by the designation Bell contact. An electrode layer 11 deposited on the rear side of the substrate 1 forms a second terminal of the Schottky contact.

FIGS. 4 to 6 show a second exemplary embodiment of the invention. Proceeding from the configuration according to FIG. 1, according to FIG. 4 the barrier metal 10 such as titanium, for example, is applied, to a thickness typically of at most 0.1 µm, to the surface 9 of the epitaxial layer 2 and the masking layer 3A, 3B covered with photoresist 6, the application preferably being effected by perpendicular vapor deposition. This is then followed by a lift-off strip in order to remove the photoresist 6 and the titanium material 10 situated thereon. Overhanging rims 15 of the nitride layer 3B are removed by etching in hot phosphoric acid selectively with respect to the titanium material 10.

Afterwards, in accordance with FIG. 5, the high barrier metal layer 4 made of platinum is sputtered on isotropically. Platinum regions 16 situated between the titanium layer 10 and the oxide layer 3A are siliconized in order to form the the protective ring. The platinum is sputtered back as far as the nitride layer 3B, the titanium and the platinum silicide 16 in the protective ring being subjected to only superficial sputtering.

The Schottky contact is completed after the vapor deposition and pattering of a Bell contact with a layer 17 containing, for example, titanium-platinum-gold, and the deposition of the electrode layer 11 on the rear side of the substrate 1 for the second terminal.

In the two exemplary embodiments according to FIG. 3 and FIG. 6, the high barrier metal 4 made of platinum or its silicide 16 fulfills the requirements of a protective ring because it compensates the barrier lowering at the junction between the Schottky metal 10 and the oxide 3A, which is caused by reduction in the interface state densities toward the oxide. For Schottky diodes with a typical diameter of 5 µm, the parasitic capacitance is approximately 5 fF (measured for a voltage U=0 V).

We claim:

1. A method for producing a Schottky diode, which comprises the steps of:

provide a semiconductor layer having a surface;

producing a mask layer on the semiconductor layer, the mask layer formed so as to leave a region free of the mask layer on the surface of the semiconductor layer, the region provided for forming a Schottky contact;

covering the mask layer and the semiconductor layer with a barrier metal layer having edges for forming the Schottky contact, a ring shaped area remaining exposed on the surface of the semiconductor layer between the mask layer and the edges of the barrier metal layer; and covering the ring shaped area with a high barrier metal and the high barrier metal forming a protective ring.

2. The method according to claim 1, which comprising using platinum as the high barrier metal.

3. The method according to claim 1, which comprises applying the high barrier metal to a thickness of approximately 0.1 µm.

4. The method according to claim 1, which comprises forming the mask layer as a two-part layer formed of a silicon oxide layer and, on top of that, a silicon nitride layer is applied and the mask layer is patterned, and undercutting the silicon nitride layer for forming overhanging rims.

5. The method according to claim 4, which comprises applying the silicon oxide layer to a thickness of approximately 0.2 µm and applying the silicon nitride layer to a thickness of approximately 0.1 µm.

6. The method according to claim 1, which comprises forming the barrier metal layer by depositing titanium to a thickness of at most 0.1 µm.

7. The method according to claim 1, which comprises forming the semiconductor layer from silicon and siliconizing the high barrier metal after its applied.

* * * * *